US012782819B2

(12) United States Patent
Motoi et al.

(10) Patent No.: US 12,782,819 B2
(45) Date of Patent: Nov. 3, 2026

(54) METHOD FOR PRODUCING RECYCLED DEVELOPER AND METHOD FOR PRODUCING FLEXOGRAPHIC PRINTING PLATE USING SAME

(71) Applicant: TOYOBO MC Corporation, Osaka (JP)

(72) Inventors: Keiichi Motoi, Okayama (JP); Daiki Yoshioka, Okayama (JP)

(73) Assignee: TOYOBO MC CORPORATION, Osaka (JP)

( * ) Notice: Subject to any disclaimer, the term of this patent is extended or adjusted under 35 U.S.C. 154(b) by 619 days.

(21) Appl. No.: 18/271,975

(22) PCT Filed: Mar. 7, 2022

(86) PCT No.: PCT/JP2022/009590

§ 371 (c)(1),
(2) Date: Jul. 12, 2023

(87) PCT Pub. No.: WO2022/196406

PCT Pub. Date: Sep. 22, 2022

(65) Prior Publication Data

US 2024/0085848 A1 Mar. 14, 2024

(30) Foreign Application Priority Data

Mar. 19, 2021 (JP) ................................ 2021-045763

(51) Int. Cl.
*G03F 7/32* (2006.01)
*B41M 1/04* (2006.01)
(Continued)

(52) U.S. Cl.
CPC ................ *G03F 7/32* (2013.01); *B41M 1/04* (2013.01); *G03F 7/00* (2013.01); *G03F 7/3092* (2013.01)

(58) Field of Classification Search
CPC ........................................................ G03F 7/30
See application file for complete search history.

(56) References Cited

U.S. PATENT DOCUMENTS

| | | | | |
|---|---|---|---|---|
| 5,759,743 | A * | 6/1998 | Muramoto | G03F 7/3092 396/626 |
| 2013/0230808 | A1 | 9/2013 | Suzuki et al. | |
| 2019/0094720 | A1* | 3/2019 | De Caria | G03F 7/24 |

FOREIGN PATENT DOCUMENTS

| | | | |
|---|---|---|---|
| JP | 6-194824 | A | 7/1994 |
| JP | 2011-232407 | A | 11/2011 |
| WO | 2018/061958 | A1 | 4/2018 |

OTHER PUBLICATIONS

Notification of Transmittal of Translation of the International Preliminary Report on Patentability (Form PCT/IB/338) issued in counterpart International Application No. PCT/JP2022/009590 mailed Sep. 28, 2023 with Forms PCT/IB/373 and PCT/ISA/237. (5 pages).

(Continued)

*Primary Examiner* — Chanceity N Robinson
(74) *Attorney, Agent, or Firm* — WHDA, LLP

(57) ABSTRACT

A method is disclosed for producing a recycled developer from a waste developer generated by development of a water-developable flexographic printing original plate that has a photosensitive resin layer made from a photosensitive resin composition containing a water-dispersible resin. The method includes: leaving the waste developer to stand still in a tank so as to emerge and flocculate the photosensitive resin composition dispersed in the waste developer and thus form a solid-liquid mixed phase containing a resin flocculate beneath a liquid surface of the waste developer; and discharging the solid-liquid mixed phase containing the resin flocculate from an outlet formed on a side surface of the tank and obtaining, as a recycled developer, a liquid left in the tank, characterized in that a level of the waste developer in (Continued)

the tank at the time of starting the discharge is higher than the lowest position of an aperture of the outlet.

12 Claims, 3 Drawing Sheets

(51) Int. Cl.
*G03F 7/00* (2006.01)
*G03F 7/30* (2006.01)

(56) References Cited

OTHER PUBLICATIONS

International Search Report dated May 24, 2022, issued in counterpart International Application No. PCT/JP2022/009590. (2 pages).
Extended European Search Report dated Jun. 20, 2025, issued in counterpart EP Application No. 22771160.3.(10 pages).

* cited by examiner

[Fig. 1]
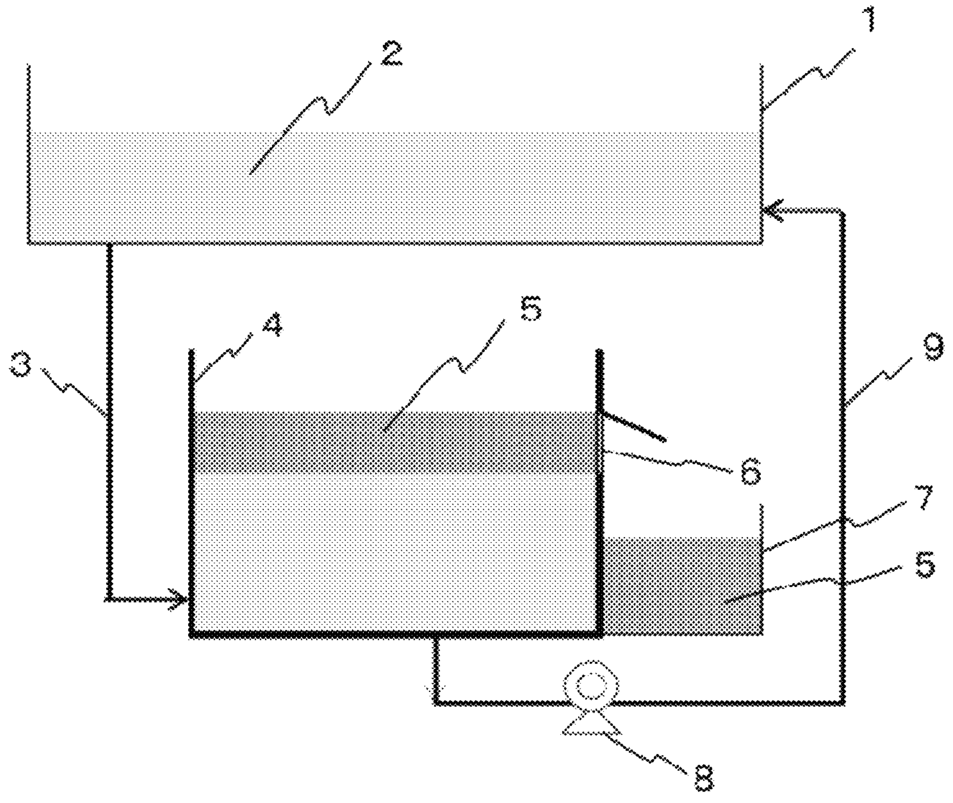
[Fig. 2]
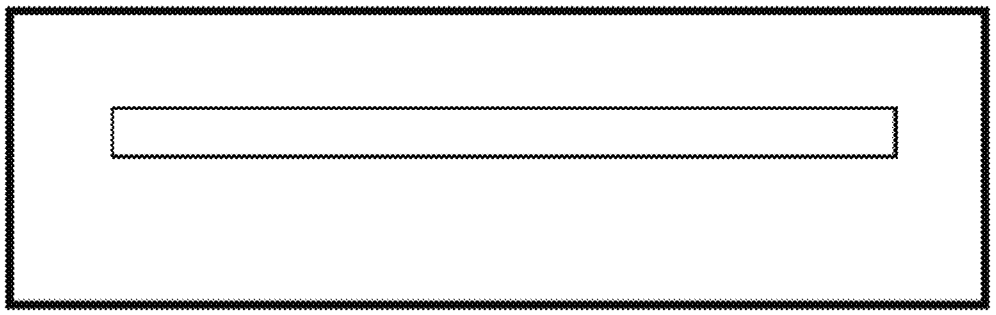

[Fig. 3]
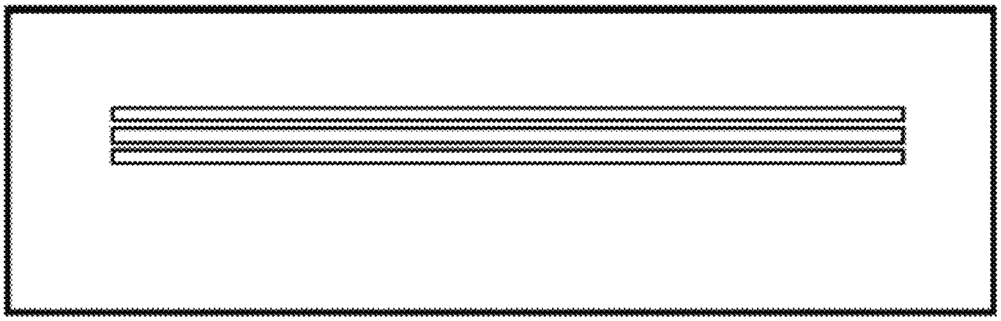
[Fig. 4]
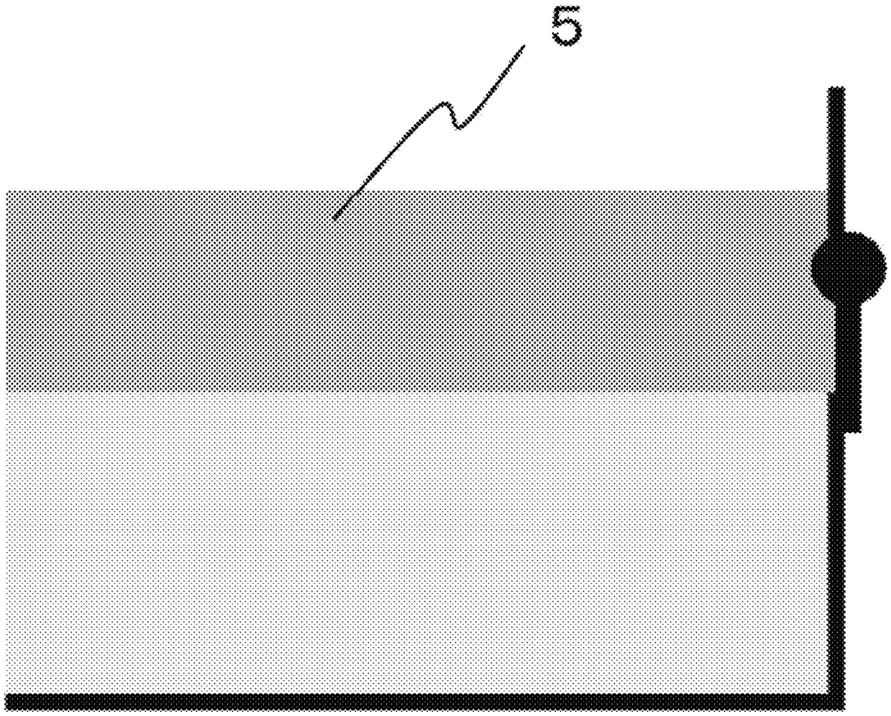

[Fig. 5]

METHOD FOR PRODUCING RECYCLED DEVELOPER AND METHOD FOR PRODUCING FLEXOGRAPHIC PRINTING PLATE USING SAME

TECHNICAL FIELD

The present invention relates to a method for producing a recycled developer from a waste developer generated by development of a water-developable flexographic printing original plate, and a method for producing a flexographic printing plate using the recycled developer as a developer.

BACKGROUND ART

A flexographic printing original plate generally has a structure including, on a support, a photosensitive resin layer made from a photosensitive resin composition. Such a flexographic printing original plate is made into a flexographic printing plate, for example, by selectively exposing a photosensitive resin layer to UV light and developing the exposed photosensitive resin layer with an aqueous developer. By the development, the photosensitive resin composition of an unexposed portion in the photosensitive resin layer is removed from the printing plate and dispersed or dissolved in the developer. When the development of the photosensitive resin layer is repeated using the identical developer, the concentration of the photosensitive resin composition dispersed in the developer is raised. As a result, the developing speed is lowered, and the dispersed photosensitive resin composition is flocculated and thus generates a resin flocculate. This resin flocculate reattaches to the surface of a printing plate and lowers the quality of the surface of the plate. Therefore, it is necessary to dispose of the developer having a high concentration of the photosensitive resin composition and restart a plate-making using a new replacement developer. However, the repetition of disposal of a used developer and replacement of the used developer with a new developer is not preferred in terms of environmental load and production costs. Therefore, removing the photosensitive resin composition from a used developer and reuses the developer is being attempted.

Patent Document 1 discloses a method for flocculating a resin component dispersed in a developer by a flocculant and separating a flocculated resin solid content. The flocculant, however, is expensive, and the use of the flocculant is not preferred from the viewpoint of costs. Further, the developer having the flocculant added thereto exhibits considerably-low developing speed and there is therefore a fundamental problem that such a developer cannot be reused as a developer.

Patent Document 2 discloses a method for recycling a developer by flocculating a photosensitive resin composition with a specially dedicated disperse-material filter and further filtering a flocculate with another flocculate filter. In this method, however, the use of the specially dedicated disperse-material filter and the flocculate filter is essential, and troublesome work of maintaining the two filters has been required.

Patent Document 3 discloses a method for producing a recycled developer by treating a waste developer with a ceramic filter so as to remove an undissolved resin component in the waste developer. Also in this method, however, burden of maintenance has been large because backwashing of the filter has frequently been required so as to prevent clogging in the filter.

PRIOR ART DOCUMENT

Patent Document

Patent Document 1: Japanese Patent Application Laid-Open (JP-A) No. 194824/94

Patent Document 2: Japanese Patent Application Laid-Open (JP-A) No. 2011-232407

Patent Document 3: WO 2018/061958

DISCLOSURE OF THE INVENTION

Problem that the Invention is to Solve

The present invention has been conceived of to solve the problems of conventional techniques described above. An object of the present invention is to provide a method for easily producing, without a requirement of a special pretreatment and frequent maintenance of a device, a recycled developer by flocculating a photosensitive resin composition dispersed in a waste developer of a water-developable flexographic printing original plate, and separating the photosensitive resin composition from the waste developer; and a method for producing a flexographic printing plate using the recycled developer as a developer.

Means for Solving the Problem

As a result of earnest study to achieve the object, the inventors of the present invention have found that a recycled developer having a low concentration of solid content is obtained with a high recovery rate by an easy method comprising the steps of: leaving a waste developer to stand still in a tank for a long time so as to emerge and flocculate, due to the difference in specific gravity, a photosensitive resin composition dispersed in the waste developer and thus form a solid-liquid mixed phase containing a resin flocculate beneath a liquid surface of the waste developer; and discharging the solid-liquid mixed phase from an outlet formed on a side surface of the tank at an upper part thereof and obtaining, as a recycled developer, a liquid left in the tank. The present invention has thus been completed.

Thus, the present invention is constituted from the following (1) to (12).

(1) A method for producing a recycled developer from a waste developer generated by development of a water-developable flexographic printing original plate that has a photosensitive resin layer made from a photosensitive resin composition containing a water-dispersible resin, wherein the method comprises the steps of:

leaving the waste developer to stand still in a tank so as to emerge and flocculate the photosensitive resin composition dispersed in the waste developer and thus form a solid-liquid mixed phase containing a resin flocculate beneath a liquid surface of the waste developer; and discharging the solid-liquid mixed phase containing the resin flocculate from an outlet formed on a side surface of the tank and obtaining, as a recycled developer, a liquid left in the tank, characterized in that a level of the waste developer in the tank at the time of starting the discharge is higher than the lowest position of an aperture of the outlet.

(2) The method according to (1), wherein the level of the waste developer in the tank at the time of starting the discharge is higher than the lowest position of the aperture of the outlet by a height corresponding to 3% or more of the depth of the tank.

(3) The method according to (1), wherein, when the level of the waste developer in the tank at the time of starting the discharge is set to a height corresponding to 53% or more of a depth of the tank, the level is higher than the lowest position of the aperture of the outlet by a height corresponding to 3% or more of the depth of the tank.

(4) The method according to any one of (1) to (3), wherein the level of the waste developer in the tank at the time of starting the discharge is higher than the lowest position of the aperture of the outlet by a height corresponding to 30% or less of the depth of the tank.

(5) The method according to any one of (1) to (4), wherein, when the level of the waste developer in the tank after leaving the waste developer to stand still in the tank is as high as or lower than the lowest position of the aperture of the outlet, the method further comprises a step of transferring water or a developer to the tank before the discharging so as to make the level of the waste developer in the tank higher than the lowest position of the aperture of the outlet.

(6) The method according to any one of (1) to (5), wherein the method further comprises a step of, before leaving the waste developer to stand still in the tank, transferring the waste developer from a developing bath to the tank.

(7) The method according to any one of (1) to (6), wherein the lowest position of the aperture of the outlet is at a height corresponding to 50% or more of the depth of the tank.

(8) The method according to any one of (1) to (7), wherein the lowest position of the aperture of the outlet is at a height corresponding to 55 to 90% of the depth of the tank.

(9) The method according to any one of (1) to (8), wherein the tank has a substantially rectangular parallelepiped shape, a substantially cubic shape, or a substantially cylindrical shape.

(10) The method according to (9), wherein, when the tank has a substantially rectangular parallelepiped shape or a substantially cubic shape, the maximum width of the aperture of the outlet is 50% or more of the maximum width of the tank.

(11) The method according to any one of (1) to (10), wherein the recycled developer has a concentration of solid content of 3.5 mass % or less.

(12) A method for producing a water-developable flexographic printing plate, characterized by using, as a developer, the recycled developer obtained by the method according to any one of (1) to (11).

Effects of the Invention

According to the method of the present invention, it is possible to produce a recycled developer having a low concentration of solid content by an easy method, with a high recovery rate, and without a requirement of a special pretreatment for flocculating a photosensitive resin composition and frequent maintenance of a device.

BRIEF DESCRIPTION OF THE DRAWINGS

FIG. 1 illustrates one example of a developing device of a water-developable flexographic printing original plate used in a method according to the present invention.

FIG. 2 illustrates one example of the shape of an outlet formed on a side surface of a tank used in the method according to the present invention.

FIG. 3 illustrates another example of the shape of an outlet formed on a side surface of a tank used in the method according to the present invention.

FIG. 4 illustrates one example of an outlet formed on a side surface of a tank used in the method according to the present invention, wherein the outlet has a lid and the lid is in a closed state.

FIG. 5 illustrates one example of an outlet formed on a side surface of a tank used in the method according to the present invention, wherein the outlet has a lid and the lid is in an opened state.

MODE FOR CARRYING OUT THE INVENTION

The method for producing a recycled developer from a waste developer of a water-developable flexographic printing original plate and the method for producing a flexographic printing plate using the recycled developer as a developer of the present invention will be illustrated hereinafter in detail.

First, FIG. 1 illustrates one example of a developing device of a water-developable flexographic printing original plate used in a method according to the present invention. In FIG. 1, 1 represents a developing bath, in which is stored a developer 2 used in development of a flexographic printing original plate. A pipe is represented by 3, and a developer having a high concentration of a photosensitive resin composition as a result of repetitive development is, as a waste developer, transferred from the developing bath 1 to a stationary tank 4 via the pipe 3. FIG. 1 illustrates a state of the waste developer left to stand still in the stationary tank 4. Particles of a resin flocculate 5 are emerged and gathered to the above and a solid-liquid mixed phase containing the resin flocculate is formed beneath the liquid surface of the waste developer. An outlet represented by 6 is formed on a side surface of the stationary tank 4. The solid-liquid mixed phase containing the resin flocculate 5 is discharged from the outlet 6 to a resin flocculate recovery tank 7. A pump is represented by 8. A recycled developer wherein the resin flocculate 5 has been removed therefrom and thus a concentration of solid content has been lowered is returned to the developing bath 1 via a pipe 9 by the pump 8.

FIG. 1 illustrates an aspect of providing a stationary tank as the tank and transferring a waste developer from a developing bath to the stationary tank. Providing a stationary tank other than a developing bath as described above causes advantages that next development can be performed during leaving a waste developer to stand still and that a resin component separated from the waste developer left to stand still is never deposited on a brush or the like immersed in the liquid in the developing bath. The present invention, however, is not limited to this aspect. For example, the developing bath may be configured similarly to the stationary tank so as to perform in the developing bath the same steps as the steps performed in the stationary tank. In the present invention, the stationary tank or the developing bath configured above can be used as a tank for leaving a waste developer to stand still in producing a recycled developer from a waste developer.

In the method for producing a recycled developer according to the present invention, the waste developer used as a raw material is generated by development of a water-developable flexographic printing original plate. Therefore, first, a configuration of the water-developable flexographic printing original plate, development, and generation of a waste developer by the development are described.

The water-developable flexographic printing original plate has a basic configuration including, on a support, a photosensitive resin layer made from a photosensitive resin composition containing a water-dispersible resin. The photosensitive resin composition contains, in addition to the water-dispersible resin, a photopolymerizable monomer and a photopolymerization initiator.

Examples of the water-dispersible resin include various resins such as a styrene-based resin, an olefin-based resin, a polyester-based resin, a polyurethane-based resin, a 1,2-polybutadiene-based resin, a vinyl chloride-based resin, and a polyamide-based resin. A particularly preferred water-dispersible resin is latex having as a whole a weight-average degree of gelation of 30% or more. The latex may be formed of a single type of latex or formed of a mixture containing a plurality of types of latex. It is possible to use, for example, polybutadiene latex, polystyrene-butadiene copolymer latex, polyacrylonitrile-butadiene copolymer latex, or methyl methacrylate-butadiene copolymer latex. Among these examples, polybutadiene latex and an acrylonitrile-butadiene copolymer are preferred. The latex is preferred to have as a whole a weight-average degree of gelation of 30% or more, and more preferred to be 50% or more. By using the latex having a degree of gelation in such a range, the flotation and the flocculation may be easily caused.

The water-dispersible resin is a main constituent component of the photosensitive resin layer. Therefore, a photosensitive resin composition dispersed in a used developer contains much of the water-dispersible resin derived from the constituent component of the photosensitive resin layer at an unexposed portion in the flexographic printing original plate. These water-dispersible resins have a lower specific gravity than water. Therefore, by leaving a waste developer to stand still as described later, these water-dispersible resins can be emerged and easily separated from the remaining aqueous developer.

The photopolymerizable monomer is not particularly limited as long as it is a monomer that can crosslink the water-dispersible resin and is a compound compatible with the water-dispersible resin. Specific examples of the photopolymerizable monomer include an acrylic acid ester, an acrylic amide, a methacrylic acid ester, a methacrylic amide, an allyl compound, a vinyl ether, a vinyl ester, a styrene, and a crotonic acid ester. The photopolymerizable monomer is selected from compounds having an addition-polymerizable unsaturated bond. The compounds described above may be used singly or in combination of two or more thereof. The blending amount of the photopolymerizable monomer is preferred to be 3 parts by mass or more and 80 parts by mass or less, and further preferred to be 5 parts by mass or more and 20 parts by mass or less relative to 100 parts by mass of the water-dispersible resin.

The photosensitive resin layer may also contain a plasticizer so as to impart softness. As to the plasticizer, any of known compounds can be selected, but particularly one that is a liquid and has a specific gravity of less than 1.0 is preferred from the viewpoint of emergence of resin. Specific examples of the plasticizer include butadiene, a styrene-butadiene copolymer, and a polyacrylonitrile-butadiene copolymer.

As to the photopolymerization initiator, any of known compounds conventionally used in a photosensitive resin composition can be selected, but particularly a benzoin-based photopolymerization initiator, a phenone-based photopolymerization initiator, and an anthraquinone-based photopolymerization initiator are preferred. Specific examples of the benzoin-based photopolymerization initiator include benzoin, benzoin methyl ether, benzoin ethyl ether, benzoin-n-propyl ether, α-methylbenzoin, α-ethylbenzoin, α-phenylbenzoin, and α-allylbenzoin. Specific examples of the phenone-based photopolymerization initiator include benzophenone, ω-bromoacetophenone, and acetophenone. Specific examples of the anthraquinone-based photopolymerization initiator include anthraquinone, chloroanthraquinone, methylanthraquinone, and ethylanthraquinone. These photopolymerization initiators may be used singly or in combination of two or more thereof. The blending amount of the photopolymerization initiator is preferred to be 0.1 part by mass or more and 5 parts by mass or less, and further preferred to be 0.5 part by mass or more and 2.0 parts by mass or less relative to 100 parts by mass of the water-dispersible resin.

To the photosensitive resin layer, a dye, a pigment, a polymerization inhibitor, an antioxidant, a photodegradation inhibitor, or the like can be added as necessary so as to improve the performance of the photosensitive resin layer. Further, a resin, such as a polyamide resin, an epoxy resin, and a polyurethane resin, which is compatible with the water-dispersible resin can also be blended so as to improve wear resistance.

The developer used in development of the water-developable flexographic printing original plate is an aqueous developer containing water as a main component. Specifically, a developer containing, in addition to water, an alkaline compound such as sodium hydroxide and sodium carbonate, and a surfactant is preferred. The alkaline compound is blended so as to set the pH of the developer to an alkaline range (preferably 8.0 to 11.0). The surfactant is blended so as to promote the dispersion of the photosensitive resin into water and maintain the dispersion state thereof. The concentration of the surfactant in the developer is 0.5 to 10 mass %. The developer may also contain an organic solvent or the like in such an extent that does not lower the solubility of the alkaline compound and the surfactant. The developer is preferred to be used at a developer temperature of 25° C. to 50° C., and especially preferred to be used at a developer temperature of 35° C. to 45° C.

Optimal examples of the surfactant include a sodium alkylnaphthalene sulfonate and a sodium alkylbenzene sulfonate. Other usable examples of the surfactant include an anionic surfactant containing a carboxylate, a sulfuric acid ester salt, a sulfonate, a phosphoric acid ester salt, or the like; a nonionic surfactant such as a polyethylene glycol chain-containing compound, a polyhydric alcohol derivative, and a sorbitan derivative; a cationic surfactant containing a primary to tertiary amine salt, a quaternary ammonium salt, or the like; and an ampholytic surfactant containing an amino acid or betaine hydrophilic group.

The method for developing a flexographic printing original plate is not particularly limited as long as it is a method enabling a relief image to be formed by washing out a photosensitive resin composition of a non-photocured portion in a printing plate using an aqueous developer. Examples of the method include a method for scrubbing out a photosensitive resin composition with a brush by a developer, and a method for scrubbing out a photosensitive resin composition of a non-photocured portion by spraying and a brush in combination. For such a brush, the diameter of a single yarn of a brush, the diameter of an implantation hole, and the pitch distance between implantation holes may be selected as appropriate. Specifically, a brush is preferred that has a pitch distance between implantation holes of 6 to 10 mm, a diameter of a hole for implanting a hair bundle of 5 to 8 mm, and a diameter of a single yarn of 160 to 200 μmm. Generally, a developer is repetitively used by the developing method described above until the concentration of a photosensitive resin composition becomes higher than a specific level and the developing speed is lowered. The developer is thereafter called a waste developer. The present invention is a method for producing a recycled developer from the waste developer generated as described above. Hereinafter, this method is described in detail.

In the method according to the present invention, a waste developer is left to stand still in a tank 4. The waste developer contains a high-concentration photosensitive resin composition dispersed therein. This photosensitive resin composition mainly consists of a water-dispersible resin, and therefore has a specific gravity of less than 1.0 and is lighter than water which is a main component of an aqueous developer used in development of a water-developable flexographic printing original plate. Therefore, when the waste developer is left to stand still, particles of the photosensitive resin composition dispersed in the waste developer are emerged due to the difference in specific gravity and spatially brought close to each other. Then, the photosensitive resin composition a part of which has already been flocculated in the waste developer is further flocculated and a resin flocculate 5 is thus formed. As a result, the tank 4 realizes therein a separation state in which, as illustrated in FIG. 1, the resin flocculate 5 is present immediately beneath the liquid surface of the waste developer, and components (the aqueous developer containing water as a main component) constituting the waste developer, other than the resin flocculate are present beneath the resin flocculate. The resin flocculate 5 present immediately beneath the liquid surface of the waste developer is not actually present singly as the resin flocculate 5, but is present in a form of a solid-liquid mixed phase in which the resin flocculate 5 and the aqueous developer are mixed to each other. On a side surface of the tank 4, an outlet 6 for discharging the resin flocculate 5 is formed. In the present invention, by discharging, from the outlet 6 of the tank 4, the solid-liquid mixed phase formed beneath the liquid surface of the waste developer and containing the resin flocculate 5, the resin flocculate 5 is efficiently removed. As a result, a recycled developer having a low concentration of solid content can be obtained with a high recovery rate.

When the waste developer is left to stand still in the tank, it is important to stationarily leave the waste developer for a certain time without any stir. The stationary time is preferred to be 5 hours or more, and further preferred to be 8 hours or more. The upper limit of the stationary time is not particularly limited, but is at most 24 hours. With a sufficient stationary time ensured as described above, it is possible to emerge and flocculate most of the photosensitive resin composition dispersed in the waste developer and securely form the solid-liquid mixed phase containing the resin flocculate beneath the liquid surface of the waste developer.

The tank is preferred to have a substantially rectangular parallelepiped shape, a substantially cubic shape, or a substantially cylindrical shape. Among these shapes, a substantially rectangular parallelepiped shape and a substantially cylindrical shape having a large surface-area ratio are preferred. Particularly, a substantially rectangular parallelepiped shape is preferred because it enables effective use of the space in the device and facilitates the discharge from the outlet.

The outlet formed on the side surface of the tank is preferred to have a substantially circular shape, a substantially square shape, a substantially rectangular shape, or a slit shape. Among these shapes, a rectangle having the longitudinal direction thereof along the width direction of the tank as illustrated in FIG. 2 is particularly preferred in terms of facilitating separation. Alternatively, the outlet may have a plurality of slit shapes along the height direction as illustrated in FIG. 3. The outlet is preferred to have a height of 1 cm to 10 cm, and further preferred to be a height of 4 cm to 8 cm. The outlet having a smaller height than this range may easily cause clogging of the resin flocculate, and the outlet having a larger height may increase the discharge volume and may possibly lower the recovery rate. When the tank has a substantially rectangular parallelepiped shape or a substantially cubic shape, the maximum width of an aperture of the outlet is preferred to be 50% or more, and further preferred to be 85% or more of the maximum width of the tank. When the tank has a substantially rectangular parallelepiped shape or a substantially cubic shape, the maximum width of the tank means the larger one between the length and the width. When the tank has a substantially cylindrical shape, the length along the circumferential direction of the outlet is preferred to be ⅛ or more of the circumference of a horizontal sectional shape of the tank. By setting the maximum width and the length along the circumferential direction of the aperture of the outlet as described above, the discharge can smoothly be performed.

The outlet formed on the side surface of the tank is preferred to be provided with an openable lid as illustrated in FIGS. 4 and 5. When the liquid surface of the waste developer is above the outlet, the resin flocculate 5 floating immediately beneath the liquid surface of the waste developer can easily be separated and discharged by opening the lid that has been closed. The lid may have a structure in which the lid has a shape fitted to the outlet or in which something tabular is slid. A method for opening the lid is considered to be performed manually or electrically.

The position of the outlet of the tank is on the side surface of the tank. By setting the position of the outlet on the side surface, the resin flocculate floating immediately beneath the liquid surface of the waste developer can easily be separated. The lowest position of the aperture of the outlet is preferred to be at a height corresponding to 50% or more of the depth of the tank, and more preferred to be at a height corresponding to 55 to 90% of the depth of the tank. When the lowest position is set at a height of less than 50%, the difference in height from the level of the waste developer may be excessively large, whereby the discharge volume may be increased, the resin flocculate floating immediately beneath the liquid surface of the waste developer may be collapsed, and the concentration of solid content in the recycled developer may be raised.

The method according to the present invention employs the following two discharge methods depending on the relationship between the position of the liquid surface of the waste developer after being left to stand still and the position of the outlet. First, when the level of the waste developer in the tank after the waste developer is left to stand still is higher than the lowest position of the aperture of the outlet, the resin flocculate floating immediately beneath the liquid surface of the waste developer can be separated and discharged from the outlet by opening the outlet. The level of the waste developer in the tank at the time of starting the discharge is preferred to be higher than the lowest position of the aperture of the outlet by a height corresponding to 3% or more of the depth of the tank, more preferred to be by a height corresponding to 5% or more of the depth of the tank, and further preferred to be by a height corresponding to 7% or more of the depth of the tank. When this difference in height is less than the above lower limit, the resin flocculate floating immediately beneath the liquid surface of the waste developer may not be sufficiently discharged and may possibly be left in the tank. The upper limit of this difference in height is preferred to be 30% or less, and more preferred to be 20% or less, and further preferred to be 15% or less. When this difference in height is more than the above upper limit, the discharge volume may be increased, whereby the resin flocculate floating immediately beneath the liquid surface of the waste developer may be collapsed, and the concentration of solid content in the recycled developer may be raised.

When the lowest position of the aperture of the outlet is at a height corresponding to 50% or more of the depth of the tank and the level of the waste developer in the tank at the time of starting the discharge is higher than the lowest position of the aperture of the outlet by a height corresponding to 3% or more of the depth of the tank, the tank has, for example, such a depth that the level of the waste developer in the tank at the time of starting the discharge is a height corresponding to 53% or more of the depth of the tank. Also for this case, the above description about the preferred range of the level of the waste developer in the tank at the time of starting the discharge is valid.

On the other hand, when the level of the waste developer in the tank after the waste developer is left to stand still is as high as or lower than the lowest position of the aperture of the outlet, the discharge cannot directly be performed. Therefore, after the photosensitive resin composition dispersed in the waste developer is emerged and flocculated by leaving the waste developer to stand still and the solid-liquid mixed phase containing the resin flocculate is formed beneath the liquid surface of the waste developer, water or a developer is transferred to the tank so as to raise the liquid surface of the waste developer to a level higher than the outlet. By opening the outlet in this state, the resin flocculate floating immediately beneath the liquid surface of the waste developer can be separated and discharged from the outlet. When water is transferred, it is desired to add a surfactant, a pH adjuster, or the like because the recycled developer is diluted with water and may possibly lower the developing speed. Regarding the level of the waste developer in the tank at the time of starting the discharge, also applicable to this case are the same conditions as when the level of the waste developer in the tank after the waste developer is left to stand still is higher than the lowest position of the aperture of the outlet.

In both the cases, at the time of discharging, from the tank, the resin flocculate floating immediately beneath the liquid surface of the waste developer by opening the outlet, flowing water may be injected from a nozzle, which is provided on a wall surface opposite to the outlet, toward the outlet so as to wash the resin flocculate away. Alternatively, the resin flocculate floating immediately beneath the liquid surface of the waste developer may be suctioned from the outlet. Considered as a suction method is, for example, a method for performing suctioning with a pump through a pipe connected to the outlet, or a method for using a vacuum cleaner for dry and wet use. The washing away and the suctioning make the discharge more quick and efficient.

The waste developer used as a raw material for producing the recycled developer is preferred to have a concentration of solid content of 5.0 mass % or more, and more preferred to be 6.0 mass % or more, in terms of facilitating formation of the resin flocculate. This solid content is mainly the photosensitive resin composition dispersed in the waste developer.

In a configuration in which a stationary tank other than the developing bath is provided as a tank for leaving the waste developer to stand still, after the solid-liquid mixed phase containing the resin flocculate is separated and discharged from the stationary tank, a liquid left in the stationary tank can directly and/or indirectly be returned to the developing bath as the recycled developer and reused. In cases of indirectly returning the liquid, for example, a tank for recycled developer is provided in which the recycled developer is temporarily stored, and the recycled developer can be returned to the developing device as necessary. In cases of directly returning the liquid, the recycled developer can be returned to a developing section or a rinsing section of a developing machine.

In the recycled developer produced by the method according to the present invention, the resin condensate has been efficiently removed therefrom. Therefore, the recycled developer produced by the method according to the present invention has a concentration of solid content as low as 3.5 mass % or less, and more preferred to be 3.0 mass % or less, and can maintain sufficient developing properties. This solid content is mainly the photosensitive resin composition dispersed in the recycled developer. Accordingly, the recycled developer obtained by the method according to the present invention can, without causing any problems, be used as a replacement of a normal developer in the production of a water-developable flexographic printing plate. In the method according to the present invention, the resin solid content in the recycled developer can remarkably be decreased. Accordingly, separation of the resin flocculate with a filter is not particularly needed. However, when the recycled developer containing less resin solid content is desired to be obtained stably by a continuous operation, the method may be performed in combination with filtration using a simple filter such as a nonwoven fabric.

EXAMPLES

The effects of the method for producing a recycled developer according to the present invention are described by way of the following examples. The present invention, however, is not limited to these examples. Examples 1 to 8 are used to describe particularly suitable aspects of the present invention. The measurement and the evaluation of performance in the examples and comparative examples are performed by the following procedures.

<Concentration of Solid Content in Waste Developer>

A waste developer (10 g) wherein a resin flocculate had been removed therefrom was put in a petri dish and subjected to drying under reduced pressure. The non-volatile content after the drying was represented by mass %. This value was defined as the concentration of solid content in the waste developer.

<Concentration of Solid Content in Recycled Developer>

A recycled developer (10 g) wherein a resin flocculate had been removed therefrom was put in a petri dish and subjected to drying under reduced pressure. The non-volatile content after the drying was represented by mass %. This value was defined as the concentration of solid content in the recycled developer.

<Recovery Rate of Recycled Developer>

After a solid-liquid mixed phase containing a resin flocculate was discharged from an outlet, a liquid left in a stationary tank was recovered. The volume of the liquid was measured. The percentage of the volume with respect to the volume of a waste developer originally transferred to the stationary tank was calculated. This value was defined as the recovery rate of a recycled developer.

In Example 2, after a solid-liquid mixed phase containing a resin flocculate was discharged from an outlet, a liquid left in a stationary tank was recovered. The volume of the liquid was measured. The percentage of the volume with respect to the volume of a waste developer immediately before the discharge of the solid-liquid mixed phase was calculated. This value was defined as the recovery rate of a recycled developer.

In Comparative Example 1, after a resin flocculate was discharged through overflow, a liquid left in a stationary tank was recovered. The volume of the liquid was measured. The percentage of the volume with respect to the volume of a waste developer originally transferred to the stationary tank was calculated. This value was defined as the recovery rate of a recycled developer.

In Comparative Example 2, the volume of a liquid drained from an outlet formed on a bottom surface of a stationary tank was measured. The percentage of the volume with respect to the volume of a waste developer originally transferred to the stationary tank was calculated. This value was defined as the recovery rate of a recycled developer.

In Comparative Example 3, after a resin flocculate was scooped with a ladle and thus recovered, a liquid left in a stationary tank was recovered. The volume of the liquid was measured. The percentage of the volume with respect to the volume of a waste developer originally transferred to the stationary tank was calculated. This value was defined as the recovery rate of a recycled developer.

<Developing Speed>

Development was performed using each of the recycled developers produced in the examples and the comparative examples. It was measured how much distance the developer could wash a printing plate in the depth direction in 1 minute, and was evaluated by the following criteria.

○: 0.05 mm/min or more

Δ: 0.03 mm/min or more and less than 0.05 mm/min x: less than 0.03 mm/min

<Image Reproducibility>

Development was performed using each of the recycled developers produced in the examples and the comparative examples. The diameter of the smallest independent dot reproduced by a developed printing plate was measured, and was evaluated by the following criteria.

○: Diameter of 200 μm was reproduced.

Δ: Diameter of 300 μm was reproduced.

x: Diameter of 400 μm was not reproduced.

<Presence or Absence of Resin Attached to Surface of Printing Plate>

Development was performed using each of the recycled developers produced in the examples and the comparative examples. The presence or absence of a resin flocculate attached to the surface of an obtained printing plate was determined by visual inspection, and was evaluated by the following criteria.

○: Attachment to surface of plate was not observed.

x: Attachment to surface of plate was observed.

Example 1

A photosensitive resin composition was prepared by mixing in a container 73 parts by mass of butadiene latex (manufactured by Zeon Corporation, LX111NF: concentration of solid content 55%) and 24 parts by mass of acrylonitrile-butadiene latex (manufactured by Zeon Corporation, SX1503A: concentration of solid content 42%) as latex, 15 parts by mass of oligobutadiene acrylate (ABU-3 manufactured by Kyoeisha Chemical Co., Ltd.: number-average molecular weight 2700), 10 parts by mass of lauryl methacrylate, and 10 parts by mass of trimethylolpropane trimethacrylate as photopolymerizable compounds, 1 part by mass of benzil dimethylketal as a photopolymerization initiator, 20 parts by mass of PFT-3 (manufactured by Kyoeisha Chemical Co., Ltd.) (polymer having a urethane-urea structure and having a number-average molecular weight of about 20,000: concentration of solid content 25%) as a hydrophilic polymer, 0.1 part by mass of hydroquinone monomethyl ether as a polymerization inhibitor, and 9 parts by mass of liquid butadiene as a plasticizer together with 5 parts by mass of toluene, and subjecting the mixture to kneading using a pressure kneader at 105° C. and thereafter to distillation under reduced pressure so as to remove toluene and water. Next, a A-2-size water-developable flexographic printing original plate including a photosensitive resin layer made from this photosensitive resin composition was prepared and exposed (image area ratio 50%) Development was repetitively performed using the exposed flexographic printing original plate under the following conditions, and a waste developer having a concentration of solid content of 7.5 mass % was obtained. This flexographic printing original plate had a photosensitive resin layer that was made from a photosensitive resin composition containing, as water-dispersible resins, polybutadiene latex and polyacrylonitrile-butadiene copolymer latex (weight-average degree of gelation 80%).

<Developing Device>

A developing device having a structure illustrated in FIG. 1 was used.

<Developer>

A developer obtained by dissolving 0.46 kg of washing soap (manufactured by Japanese Consumers' Cooperative Union, component: fatty acid sodium, fatty acid potassium) in 45 L of tap water was used after heated to a developer temperature of 40° C.

<Development Brush>

A development brush was used that was obtained by implanting, under the following conditions, a nylon brush with a diameter of 150 μm in a support plate formed of a 10-mm-thick vinyl chloride chipboard.

Diameter of hole for implanting hair bundle: diameter of 20 mm

Hair-bundle implanting density: density of 120 hairs/hole

Next, the obtained waste developer was transferred from a developing bath 1 to a stationary tank 4 and left to stand still in the stationary tank 4 for 5 hours so as to emerge and flocculate the photosensitive resin composition dispersed in the waste developer and thus form a solid-liquid mixed phase containing a resin flocculate 5 beneath the liquid surface of the waste developer. The volume of the waste developer transferred to the stationary tank 4 is 45 L, and the level of the waste developer in the stationary tank 4 immediately after the transference of the waste developer to the stationary tank 4 was a height corresponding to 75% of the depth of the stationary tank 4.

The stationary tank 4 has a substantially rectangular parallelepiped shape having a dimension of 43 cm (width)×76 cm (length)×19 cm (height). A rectangle-shaped outlet 6 having a dimension of 5 cm (height)×70 cm (length) as illustrated in FIG. 2 is formed on a one-end side surface of the stationary tank. The formation position of the outlet 6 is set such that the lowest position of a rectangular aperture of the outlet is at a height corresponding to 70% of the depth of the stationary tank 4. The outlet 6 has a lid whose upper portion is fixed to a wall surface by a fixing shaft. The lid is openable around the fixing shaft as illustrated in FIGS. 4 and 5.

By opening the lid of the outlet 6 after leaving the waste developer to stand still, the solid-liquid mixed phase containing the resin flocculate 5 was discharged from the outlet 6 and recovered into a resin flocculate recovery tank 7. Thereafter, a liquid left in the stationary tank 4 was recovered as a recycled developer. The volume of the recovered recycled developer was 35 L, and the recovery rate was 78%. This recycled developer contained a little amount of the resin flocculate, but had a reduced concentration of solid content of 3.0 mass % after the removal of the resin flocculate. The developing speed, the image reproducibility, and the presence or absence of a resin attached to the surface of a printing plate were evaluated using this recycled developer. Table 1 shows the evaluation results.

Example 2

A waste developer was left to stand still in the same manner as in Example 1 except that the formation position of the outlet 6 on the one-end side surface of the stationary tank 4 was changed such that the lowest position of the rectangular aperture of the outlet was at a height corresponding to 85% of the depth of the stationary tank 4. In this case, the level of the waste developer in the stationary tank 4 immediately after the transference of the waste developer to the stationary tank 4 was below the lowest position of the aperture of the outlet, and thus the direct discharge of a solid-liquid mixed phase from the outlet was impossible. Therefore, before the discharge of the solid-liquid mixed phase from the outlet, 6 L of water were transferred to the stationary tank 4 from a side surface opposite to the side surface of the stationary tank 4 on which the outlet was formed, so as to raise the level of the waste developer in the stationary tank 4 and thus make the level higher than the lowest position of the aperture of the outlet. Thereafter, a recycled developer was recovered by discharging the solid-liquid mixed phase in the same manner as in Example 1. The volume of the recovered recycled developer was 44 L, and the recovery rate was 98%. This recycled developer contained a little amount of the resin flocculate, but had a reduced concentration of solid content of 2.7 mass % after the removal of the resin flocculate. The developing speed, the image reproducibility, and the presence or absence of a resin attached to the surface of a printing plate were evaluated using this recycled developer. Table 1 shows the evaluation results.

Example 3

A recycled developer was recovered by leaving a waste developer to stand still and discharging a solid-liquid mixed phase in the same manner as in Example 1 except that the shape of the outlet 6 formed on the one-end side surface of the stationary tank 4 was changed from the rectangular shape having a dimension of 5 cm (height)×70 cm (length) to a slit shape formed of three rectangles each having a dimension of 1.5 cm (height)×70 cm (length) as illustrated in FIG. 3, and that the lowest positions of the three rectangular apertures are set at heights corresponding to 72%, 65%, and 58% of the depth of the stationary tank 4. The volume of the recovered recycled developer was 33 L, and the recovery rate was 73%. This recycled developer contained a little amount of the resin flocculate, but had a reduced concentration of solid content of 3.0 mass % after the removal of the resin flocculate. The developing speed, the image reproducibility, and the presence or absence of a resin attached to the surface of a printing plate were evaluated using this recycled developer. Table 1 shows the evaluation results.

Example 4

A recycled developer was recovered by leaving a waste developer to stand still and discharging a solid-liquid mixed phase in the same manner as in Example 1 except that the formation position of the outlet 6 on the one-end side surface of the stationary tank 4 was changed such that the lowest position of the rectangular aperture of the outlet was at a height corresponding to 60% of the depth of the stationary tank 4. The volume of the recovered recycled developer was 29 L, and the recovery rate was 64%. This recycled developer contained a little amount of the resin flocculate, but had a reduced concentration of solid content of 3.0 mass % after the removal of the resin flocculate. The developing speed, the image reproducibility, and the presence or absence of a resin attached to the surface of a printing plate were evaluated using this recycled developer. Table 1 shows the evaluation results.

Example 5

A recycled developer was recovered by leaving a waste developer to stand still and discharging a solid-liquid mixed phase in the same manner as in Example 1 except that the number of development operations was reduced so as to decrease the concentration of solid content in the waste developer transferred to the stationary tank 4 from 7.5 mass % to 4.0 mass %. The volume of the recovered recycled developer was 35 L, and the recovery rate was 77%. This recycled developer contained a little amount of the resin flocculate, but had a reduced concentration of solid content of 3.0 mass % after the removal of the resin flocculate. The developing speed, the image reproducibility, and the presence or absence of a resin attached to the surface of a printing plate were evaluated using this recycled developer. Table 1 shows the evaluation results.

Example 6

A recycled developer was recovered by leaving a waste developer to stand still and discharging a solid-liquid mixed phase in the same manner as in Example 1 except that the stationary tank 4 was changed to one that had a substantially cubic shape having a dimension of 39 cm (width)×39 cm (length)×39 cm (height), that a rectangle-shaped outlet 6 having a dimension of 5 cm (height)×36 cm (length) as illustrated in FIG. 2 was formed on a one-end side surface of the stationary tank, and that the formation position of the outlet 6 was set such that the lowest position of a rectangular aperture of the outlet was at a height corresponding to 65% of the depth of the stationary tank 4. The volume of the recovered recycled developer was 38 L, and the recovery rate was 84%. This recycled developer contained a little amount of the resin flocculate, but had a reduced concentration of solid content of 3.0 mass % after the removal of the resin flocculate. The developing speed, the image reproducibility, and the presence or absence of a resin attached to the surface of a printing plate were evaluated using this recycled developer. Table 1 shows the evaluation results. The volume of the stationary tank 4 used in Example 6 and having a substantially cubic shape was almost the same as the volume of the substantially rectangular parallelepiped stationary tank 4 used in Example 1.

Example 7

A recycled developer was recovered by leaving a waste developer to stand still and discharging a solid-liquid mixed phase in the same manner as in Example 1 except that the stationary tank 4 was changed to one that had a substantially cylindrical shape having a dimension of 66 cm (diameter)× 19 cm (height), that a rectangle-shaped outlet 6 having a dimension of 5 cm (height)×70 cm (length along circumferential direction) as illustrated in FIG. 2 was formed on a one-end side surface of the stationary tank, and that the formation position of the outlet 6 was set such that the lowest position of a rectangular aperture of the outlet was at a height corresponding to 70% of the depth of the stationary tank 4. The volume of the recovered recycled developer was 35 L, and the recovery rate was 78%. This recycled developer contained a little amount of the resin flocculate, but had a reduced concentration of solid content of 3.0 mass % after the removal of the resin flocculate. The developing speed, the image reproducibility, and the presence or absence of a resin attached to the surface of a printing plate were evaluated using this recycled developer. Table 1 shows the evaluation results. The volume of the stationary tank 4 used in Example 7 and having a substantially cylindrical shape was almost the same as the volume of the substantially rectangular parallelepiped stationary tank 4 used in Example 1.

Example 8

A photosensitive resin composition was prepared by mixing in a container 71 parts by mass of styrene-butadiene latex (manufactured by Zeon Corporation, Nipol C4850: concentration of solid content 70%) as latex, 15 parts by mass of oligobutadiene acrylate (ABU-3 manufactured by Kyoeisha Chemical Co., Ltd.: number-average molecular weight 2700), 10 parts by mass of lauryl methacrylate, and 10 parts by mass of trimethylolpropane trimethacrylate as photopolymerizable compounds, 1 part by mass of benzil dimethylketal as a photopolymerization initiator, 20 parts by mass of PFT-3 (manufactured by Kyoeisha Chemical Co., Ltd.) (polymer having a urethane-urea structure and having a number-average molecular weight of about 20,000: concentration of solid content 25%) as a hydrophilic polymer, 0.1 part by mass of hydroquinone monomethyl ether as a polymerization inhibitor, and 9 parts by mass of liquid butadiene as a plasticizer together with 5 parts by mass of toluene, and subjecting the mixture to kneading using a pressure kneader at 105° C. and thereafter to distillation under reduced pressure so as to remove toluene and water. A waste developer was obtained by preparing, exposing, and developing a water-developable flexographic printing original plate in the same manner as in Example 1 except that the above-prepared photosensitive resin composition was used. This flexographic printing original plate had a photosensitive resin layer that was made from a photosensitive resin composition containing, as a water-dispersible resin, styrene-butadiene copolymer latex (weight-average degree of gelation 60%). A recycled developer was recovered by leaving a waste developer to stand still and discharging a solid-liquid mixed phase in the same manner as in Example 1. The volume of the recovered recycled developer was 35 L, and the recovery rate was 78%. This recycled developer contained a little amount of the resin flocculate, but had a reduced concentration of solid content of 3.2 mass % after the removal of the resin flocculate. The developing speed, the image reproducibility, and the presence or absence of a resin attached to the surface of a printing plate were evaluated using this recycled developer. Table 1 shows the evaluation results.

Comparative Example 1

A waste developer was left to stand still in the same manner as in Example 1 except that the stationary tank 4 was changed to one having no outlet for discharging a solid-liquid mixed phase. Thereafter, water was injected into the stationary tank 4 until overflow from the above of the stationary tank 4 was caused, whereby a solid-liquid mixed phase containing a resin flocculate 5 was extracted from the above of the stationary tank 4 and recovered into a resin flocculate recovery tank 7. Thereafter, a liquid left in the stationary tank 4 was recovered as a recycled developer. The volume of the recovered recycled developer was 40.5 L, and the recovery rate was 90%. The concentration of solid content in this recycled developer was 4.5 mass % after the removal of the resin flocculate, and significantly higher than those of Examples 1 to 8. The developing speed, the image reproducibility, and the presence or absence of a resin attached to the surface of a printing plate were evaluated using this recycled developer. Since the concentration of solid content was higher, all the evaluations were inferior to those of Examples 1 to 8. Table 1 shows the evaluation results.

Comparative Example 2

A waste developer was left to stand still in the same manner as in Example 1 except that the shape of the outlet formed on the stationary tank 4 was changed to a circular shape having a diameter of 5 cm, and that the formation position of the outlet was changed to the center of the bottom surface of the stationary tank 4. Thereafter, the outlet on the bottom surface of the stationary tank 4 was opened, and a liquid to be a recycled developer was thereby quietly drained from the outlet. The drainage of the liquid was finished by closing the outlet before a solid-liquid mixed phase containing a resin flocculate was drained, so as to leave the solid-liquid mixed phase in the stationary tank 4. The volume of the recovered recycled developer was 31.5 L, and the recovery rate was 70%. The concentration of solid content in this recycled developer was 4.0 mass % after the removal of the resin flocculate, and significantly higher than those of Examples 1 to 8. The developing speed, the image reproducibility, and the presence or absence of a resin attached to the surface of a printing plate were evaluated using this recycled developer. Since the concentration of solid content was higher, all the evaluations were inferior to those of Examples 1 to 8. Table 1 shows the evaluation results.

Comparative Example 3

A waste developer was left to stand still in a developing bath 1 for 5 hours instead of using the stationary tank 4 in Example 1. Thereafter, a solid-liquid mixed phase containing a resin flocculate was recovered by being scooped with a ladle. In this method, since the resin flocculate and a developer (a developer separated from the resin flocculate) were scooped together, the volume of the recovered recycled developer was 30 L, and the recovery rate was 67%. The concentration of solid content in this recycled developer was 4.5 mass % after the removal of the resin flocculate, and significantly higher than those of Examples 1 to 8. The developing speed, the image reproducibility, and the presence or absence of a resin attached to the surface of a printing plate were evaluated using this recycled developer. Since the concentration of solid content was higher, the attachment of a resin to the surface of a printing plate was observed. The evaluations were inferior to those of Examples 1 to 8. Table 1 shows the evaluation results. In the method of Comparative Example 3, the resin flocculate was attached to the interior of the developing bath when the recycled developer was drained and extracted from a lower part of the developing bath, and the interior of the developing bath was required to be cleaned. Accordingly, the method of Comparative Example 3 made operability bad and did not enable easy production of a recycled developer from a waste developer.

Comparative Example 4

A recycled developer was recovered by leaving a waste developer to stand still and discharging a solid-liquid mixed phase in the same manner as in Example 1 except that the formation position of the outlet 6 on the one-end side surface of the stationary tank 4 was changed such that the lowest position of the rectangular aperture of the outlet was at a height corresponding to 40% of the depth of the stationary tank 4. In Comparative Example 4, since the difference in height between the position of the liquid surface of the waste developer and the position of the outlet was large, the discharge volume was increased. Therefore, the volume of the recovered recycled developer was only 17 L, and the recovery rate was as low as 30%. In addition, since the difference in height between the position of the liquid surface of the waste developer and the position of the outlet was large, the resin flocculate was collapsed in the middle of the discharge and was not completely discharged, leaving a part of the resin flocculate in the stationary tank 4. Therefore the concentration of solid content in this recycled developer was 4.0 mass % after the removal of the resin flocculate, and significantly higher than those of Examples 1 to 8. The developing speed, the image reproducibility, and the presence or absence of a resin attached to the surface of a printing plate were evaluated using this recycled developer. Since the concentration of solid content was higher, the attachment of a resin to the surface of a printing plate was slightly observed. The evaluations were inferior to those of Examples 1 to 8. Table 1 shows the evaluation results.

TABLE 1

| | | Example 1 | Example 2 | Example 3 | Example 4 | Example 5 | Example 6 |
|---|---|---|---|---|---|---|---|
| Treatment conditions | Type of water-dispersible resin | polybutadiene latex/poly-acrylonitrile-butadiene copolymer | polybutadiene latex/poly-acrylonitrile-butadiene copolymer | polybutadiene latex/poly-acrylonitrile-butadiene copolymer | polybutadiene latex/poly-acrylonitrile-butadiene copolymer | polybutadiene latex/poly-acrylonitrile-butadiene copolymer | polybutadiene latex/poly-acrylonitrile-butadiene copolymer |
| | Shape of stationary tank | substantially rectangular parallelepiped shape | substantially rectangular parallelepiped shape | substantially rectangular parallelepiped shape | substantially rectangular parallelepiped shape | substantially rectangular parallelepiped shape | substantially cubic shape |
| | Level of lowest position of aperture of outlet (% of depth of stationary tank) | 70% | 85% | 72%, 65%, 58% | 60% | 70% | 65% |
| | Level of waste developer (% of depth of stationary tank) | 75% | 75% | 75% | 75% | 75% | 77% |
| | Discharge method | Discharged from outlet formed on a side surface of a stationary tank | After transferring water, discharged from outlet formed on a side surface of a stationary tank | Discharged from outlet formed on a side surface of a stationary tank | Discharged from outlet formed on a side surface of a stationary tank | Discharged from outlet formed on a side surface of a stationary tank | Discharged from outlet formed on a side surface of a stationary tank |
| Treatment results | Concentration of solid content in waste developer (mass %) | 7.5 | 7.5 | 7.5 | 7.5 | 4.0 | 7.5 |
| | Concentration of solid content in recycled developer (mass %) | 3.0 | 2.7 | 3.0 | 3.0 | 3.0 | 3.0 |
| Evaluation results | Recovery rate of recycled developer (%) | 78 | 98 | 73 | 64 | 77 | 84 |
| | Developing speed (mm/min.) | ○ (0.10) | ○ (0.12) | ○ (0.10) | ○ (0.10) | ○ (0.10) | ○ (0.10) |
| | Image reproducibility (diameter of smallest independent dot (μm)) | ○ (200) | ○ (200) | ○ (200) | ○ (200) | ○ (200) | ○ (200) |
| | Presence or absence of resin attached to surface of printing plate | ○ | ○ | ○ | ○ | ○ | ○ |

| | | Example 7 | Example 8 | Comparative Example 1 | Comparative Example 2 | Comparative Example 3 | Comparative Example 4 |
|---|---|---|---|---|---|---|---|
| Treatment conditions | Type of water-dispersible resin | polybutadiene latex/poly-acrylonitrile-butadiene copolymer | polystyrene-butadiene copolymer | polybutadiene latex/poly-acrylonitrile-butadiene copolymer | polybutadiene latex/poly-acrylonitrile-butadiene copolymer | polybutadiene latex/poly-acrylonitrile-butadiene copolymer | polybutadiene latex/poly-acrylonitrile-butadiene copolymer |
| | Shape of stationary tank | substantially cylindrical shape | substantially rectangular parallelepiped shape | substantially rectangular parallelepiped shape | substantially rectangular parallelepiped shape | substantially rectangular parallelepiped shape | substantially rectangular parallelepiped shape |
| | Level of lowest position of aperture of outlet (% of depth of stationary tank) | 70% | 70% | — | — | — | 40% |

TABLE 1-continued

| | | | | | | | |
|---|---|---|---|---|---|---|---|
| | Level of waste developer (% of depth of stationary tank) | 75% | 75% | 100% | 75% | 75% | 75% |
| | Discharge method | Discharged from outlet formed on a side surface of a stationary tank | Discharged from outlet formed on a side surface of a stationary tank | Overflow | Discharged from outlet formed on a bottom surface of a stationary tank | Recovered by scooping | Discharged from outlet formed on a side surface of a stationary tank |
| Treatment results | Concentration of solid content in waste developer (mass %) | 7.5 | 7.5 | 7.5 | 7.5 | 7.5 | 7.5 |
| | Concentration of solid content in recycled developer (mass %) | 3.0 | 3.2 | 4.5 | 4.0 | 4.5 | 4.0 |
| Evaluation results | Recovery rate of recycled developer (%) | 78 | 78 | 90 | 70 | 67 | 30 |
| | Developing speed (mm/min.) | ○ (0.10) | ○ (0.10) | Δ (0.04) | ○ (0.06) | ○ (0.10) | ○ (0.06) |
| | Image reproducibility (diameter of smallest independent dot (μm)) | ○ (200) | ○ (200) | Δ (300) | Δ (300) | ○ (200) | Δ (300) |
| | Presence or absence of resin attached to surface of printing plate | ○ | ○ | x | ○ | x | Δ |

INDUSTRIAL APPLICABILITY

The method according to the present invention provides an easy method for producing, with a high recovery rate, a recycled developer having a low concentration of solid content, without a requirement of a special pretreatment for flocculating a photosensitive resin composition and frequent maintenance of a device. Accordingly, the present invention is very useful.

EXPLANATION OF REFERENCE NUMBER

1: Developing bath
2: Developer
3: Pipe
4: Stationary tank
5: Resin flocculate
6: Outlet
7: Resin flocculate recovery tank
8: Pump
9: Pipe

The invention claimed is:

1. A method for producing a recycled developer from a waste developer generated by development of a water-developable flexographic printing original plate that has a photosensitive resin layer made from a photosensitive resin composition containing a water-dispersible resin, wherein the method comprises the steps of:

leaving the waste developer to stand still in a tank so as to emerge and flocculate the photosensitive resin composition dispersed in the waste developer and thus form a solid-liquid mixed phase containing a resin flocculate beneath a liquid surface of the waste developer; and discharging the solid-liquid mixed phase containing the resin flocculate from an outlet formed on a side surface of the tank and obtaining, as a recycled developer, a liquid left in the tank, characterized in that a level of the waste developer in the tank at the time of starting the discharge is higher than the lowest position of an aperture of the outlet, and the aperture of the outlet formed on the side surface of the tank is a rectangular slit having a longitudinal direction thereof along a width direction of the tank, and a height of 4 cm to 8 cm.

2. The method according to claim 1, wherein the level of the waste developer in the tank at the time of starting the discharge is higher than the lowest position of the aperture of the outlet by a height corresponding to 3% or more of the depth of the tank.

3. The method according to claim 1, wherein, when the level of the waste developer in the tank at the time of starting the discharge is set to a height corresponding to 53% or more of a depth of the tank, the level is higher than the lowest position of the aperture of the outlet by a height corresponding to 3% or more of the depth of the tank.

4. The method according to claim 1, wherein the level of the waste developer in the tank at the time of starting the discharge is higher than the lowest position of the aperture of the outlet by a height corresponding to 30% or less of the depth of the tank.

5. The method according to claim 1, wherein, when the level of the waste developer in the tank after leaving the waste developer to stand still in the tank is as high as or lower than the lowest position of the aperture of the outlet, the method further comprises a step of transferring water or a developer to the tank before the discharging so as to make the level of the waste developer in the tank higher than the lowest position of the aperture of the outlet.

6. The method according to claim 1, wherein the method further comprises a step of, before leaving the waste developer to stand still in the tank, transferring the waste developer from a developing bath to the tank.

7. The method according to claim 1, wherein the lowest position of the aperture of the outlet is at a height corresponding to 50% or more of the depth of the tank.

8. The method according to claim 1, wherein the lowest position of the aperture of the outlet is at a height corresponding to 55 to 90% of the depth of the tank.

9. The method according to claim 1, wherein the tank has a substantially rectangular parallelepiped shape, a substantially cubic shape, or a substantially cylindrical shape.

10. The method according to claim 9, wherein, when the tank has a substantially rectangular parallelepiped shape or a substantially cubic shape, the maximum width of the aperture of the outlet is 50% or more of the maximum width of the tank.

11. The method according to claim 1, wherein the recycled developer has a concentration of solid content of 3.5 mass % or less.

12. A method for producing a water-developable flexographic printing plate, characterized by using, as a developer, the recycled developer obtained by the method according to claim 1.

* * * * *